United States Patent
Gan

(10) Patent No.: US 10,541,255 B2
(45) Date of Patent: Jan. 21, 2020

(54) ARRAY SUBSTRATE HAVING SUB-PIXELS INCLUDING MAIN REGION PIXEL ELECTRODE AND SECONDARY REGION PIXEL ELECTRODE THAT HAVE BRANCH ELECTRODES AND SLITS HAVING DIFFERENT WIDTHS

(71) Applicant: Shenzhen China Star Optoelectronics Technology Co., Ltd., Shenzhen (CN)

(72) Inventor: Qiming Gan, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

(*) Notice: Subject to any disclaimer, the term of this patent is extended or adjusted under 35 U.S.C. 154(b) by 134 days.

(21) Appl. No.: 15/540,032

(22) PCT Filed: Apr. 19, 2017

(86) PCT No.: PCT/CN2017/081035
§ 371 (c)(1),
(2) Date: Jun. 27, 2017

(87) PCT Pub. No.: WO2018/184257
PCT Pub. Date: Oct. 11, 2018

(65) Prior Publication Data
US 2018/0294281 A1 Oct. 11, 2018

(30) Foreign Application Priority Data
Apr. 5, 2017 (CN) .......................... 2017 1 0218707

(51) Int. Cl.
*H01L 27/13* (2006.01)
*H01L 27/12* (2006.01)
(Continued)

(52) U.S. Cl.
CPC .......... *H01L 27/124* (2013.01); *G02F 1/1368* (2013.01); *G02F 1/133345* (2013.01);
(Continued)

(58) Field of Classification Search
CPC ... G02F 2001/134318; G02F 1/134309; G02F 1/136213; H01L 27/124; H01L 27/1255
See application file for complete search history.

(56) References Cited

U.S. PATENT DOCUMENTS

2012/0086685 A1* 4/2012 Lee .................. G02F 1/13624
345/208
2014/0267994 A1* 9/2014 Ryu .................. G02F 1/133707
349/141

(Continued)

*Primary Examiner* — Daniel Whalen
*Assistant Examiner* — Suberr L Chi
(74) *Attorney, Agent, or Firm* — Leong C. Lei

(57) ABSTRACT

The invention provides an array substrate, each sub-pixel comprising: a control TFT and a pixel electrode connected to control TFT; the pixel electrode comprising: a main region pixel electrode and a secondary region pixel electrode, layout with a gap in-between, and a first connection electrode electrically connected to the main region pixel electrode and the secondary region pixel electrode; the main and secondary region pixel electrodes being of special shape slit structure, the main region branch electrodes having a width smaller than width of the secondary region branch electrodes, the main region slit having a width smaller than width of the secondary region slit. The structural difference in the main and secondary region pixel electrodes is used to improve color shift, leading to reducing the number of TFTs in each pixel, improving pixel aperture ratio, reduces difficulty in balance control of best common voltage between main and secondary regions.

14 Claims, 2 Drawing Sheets

(51) Int. Cl.
  *G02F 1/1368* (2006.01)
  *G02F 1/1333* (2006.01)
  *G02F 1/1343* (2006.01)
  *G02F 1/1362* (2006.01)
  *G02F 1/1337* (2006.01)

(52) U.S. Cl.
  CPC .. *G02F 1/133707* (2013.01); *G02F 1/134309* (2013.01); *G02F 1/136213* (2013.01); *H01L 27/1255* (2013.01); *G02F 2001/134345* (2013.01); *G02F 2201/123* (2013.01)

(56) References Cited

U.S. PATENT DOCUMENTS

| | | | |
|---|---|---|---|
| 2016/0062192 A1* | 3/2016 | Yang | G02F 1/134309 257/71 |
| 2016/0209714 A1* | 7/2016 | Yun | G02F 1/133512 |
| 2017/0023837 A1* | 1/2017 | Shin | G02F 1/136227 |
| 2017/0293185 A1* | 10/2017 | Park | G02F 1/133753 |
| 2017/0293186 A1* | 10/2017 | Kim | G02F 1/134309 |

* cited by examiner

ARRAY SUBSTRATE HAVING SUB-PIXELS INCLUDING MAIN REGION PIXEL ELECTRODE AND SECONDARY REGION PIXEL ELECTRODE THAT HAVE BRANCH ELECTRODES AND SLITS HAVING DIFFERENT WIDTHS

BACKGROUND OF THE INVENTION

1. Field of the Invention

The present invention relates to the field of display, and in particular to an array substrate.

2. The Related Arts

The liquid crystal display (LCD) is the most widely used panel display. The liquid crystal (LC) panel is the core part of the LCD. The LCD panel usually comprises a color filter (CF) substrate, a thin film transistor (TFT) array substrate, and a liquid crystal layer sandwiched between the two substrates. In general, the array substrate and the CF substrate are respectively disposed with pixel electrodes and common electrodes. When a voltage is applied to the pixel electrodes and the common electrodes, an electrical field is generated in the LC layer. The electrical field determines the orientation of the LC molecules, leading to adjust the polarization of incident light to the LC layer to make the LC panel display an image.

To increase the viewing angle of the LCD, the known technology generally takes a multi-domain approach, which divides a sub-pixel into a plurality of regions and causes the LC in each region to be lean in a different direction after applying a voltage so that the viewing effect from the various directions is uniform and consistent. A variety of methods for implementing a multi-domain technique are available. One method is to design the pixel electrode in a special shape, for example, a cross-like slit electrode structure with branch on the four main trunks of a cross. Specifically, the slit electrode structure comprises a vertical stripe and a horizontal stripe, and the vertical stripe and horizontal strip intersects perpendicularly with each other at the centers of the vertical and horizontal stripes, which divides the entire pixel electrode area into four domains. Each pixel electrode domain comprises a stripe branch forming ±45° or ±135° angle with a vertical stripe or horizontal stripe, and each stripe branch is on the same plane as the vertical stripe and horizontal stripe. The special pattern of the pixel electrode generates tilt electrical field to induce the LC molecules in different domain to lean towards different directions.

The special shape slit electrode, due to the same angle between the stripe branch and the horizontal or vertical stripe in each pixel electrode domain, will cause a certain extent of visual chromatic aberration or visual color deviation, and the transmission rate of the LC panel will also drop. For improvement, the prior art divides a sub-pixel into a main region and a secondary region, disposes a separate main region pixel electrode in the main region and a separate secondary region pixel electrode. Both the main region pixel electrode and the sub-region region pixel electrode use the aforementioned special shape slit electrode to achieve eight-domain displaying. As shown in FIG. 1, each sub-pixel of the conventional LCD comprises: a main region thin film transistor (TFT) T100, a secondary region TFT T200, a charge-sharing TFT T300, a main region liquid crystal (LC) capacitor C100, a secondary region LC capacitor C200, a main region storage capacitor C300, a secondary region storage capacitor C400; the gate of the main region TFT T100 is electrically connected to the scan line Gate corresponding to the sub-pixel, the source electrically connected to the data line Data corresponding to the sub-pixel, and the drain electrically connected to one end of the main region LC capacitor C100; the gate of the secondary region TFT T200 is electrically connected to the scan line Gate corresponding to the sub-pixel, the source electrically connected to the data line Data corresponding to the sub-pixel, and the drain electrically connected to one end of the secondary region LC capacitor C200; the gate of the charge-sharing TFT T300 is electrically connected to the scan line Gate corresponding to the sub-pixel, the source electrically connected to the array substrate common voltage Acom, and the drain electrically connected to one end of the secondary region LC capacitor C200; the other ends of the main region LC capacitor C100 and the secondary region LC capacitor C200 are connected to the CF substrate common voltage Ccom; one end of the main region storage capacitor C300 is electrically connected to one end of the main region LC capacitor C100 and the other end connected to the array substrate common voltage Acom; one end of the secondary region storage capacitor C400 is electrically connected to one end of the secondary region LC capacitor C200 and the other end connected to the array substrate common voltage Acom; one end of the main region LC capacitor C100 is the main region pixel electrode 101, and one end of the secondary region LC capacitor C200 is the secondary region pixel electrode 201. When in operation, the main region TFT T100 charges the main region pixel electrode 101, the secondary region TFT T200 charges the secondary region pixel electrode 201, and the charge-sharing TFT T300 discharges the secondary region pixel electrode 201 so that the main region and the secondary region generate different voltages to increase the viewing angle. But, the in the aforementioned sub-pixel structure, each sub-pixel comprises three TFTs. The excessive number of TFTs will cause the aperture ratio reduction for the pixel. Also, due to the use of charge-sharing technology, the pixel electrodes in the main region and the secondary region will have different voltages, which further increase the difficulty to balance control of best common voltage (Vcom) between the main region and the secondary region.

SUMMARY OF THE INVENTION

The object of the present invention is to provide an array substrate, able to improve the color shift, improve aperture ratio of the pixels, and reduce the difficulty to balance control of best common voltage between the main region and the secondary region.

To achieve the above object, the present invention provides an array substrate, comprising: a plurality of sub-pixels arranged in an array, a plurality of scan lines arranged in a parallel, interleaved and horizontal manner, and a plurality of data lines arranged in a parallel, interleaved and vertical manner;

each row of sub-pixels corresponding to a scan line, each column of sub-pixels corresponding to a data line, each sub-pixel comprising: a control thin film transistor (TFT) and a pixel electrode; the control TFT having a gate connected the scan line corresponding to the sub-pixel, a source connected to the data line corresponding to the sub-pixel, and a drain connected to the pixel electrode; the pixel electrode comprising: a main region pixel electrode and a secondary region pixel electrode, layout with a gap in-between, and a first connection electrode electrically connected to the main region pixel electrode and the secondary region pixel electrode;

the main region pixel electrode comprising: a cross-shape main region trunk electrode, the main region trunk electrode dividing the main region pixel electrode into four main region orientation areas, with each main region orientation area being disposed with a plurality of parallel stripe-shaped main region branch electrodes electrically connected to the main region trunk electrode, a main region slit being formed between two adjacent main region branch electrodes, the main region branch electrodes in two adjacent main region orientation areas being symmetrical with respect to the main region trunk electrode; the secondary region pixel electrode comprising: a cross-shape secondary region trunk electrode, the secondary region trunk electrode dividing the secondary region pixel electrode into four secondary region orientation areas, with each secondary region orientation area being disposed with a plurality of parallel stripe-shaped secondary region branch electrodes electrically connected to the secondary region trunk electrode, a secondary region slit being formed between two adjacent secondary region branch electrodes, the secondary region branch electrodes in two adjacent secondary region orientation areas being symmetrical with respect to the secondary region trunk electrode;

the main region branch electrodes having a width smaller than width of the secondary region branch electrodes, the main region slit having a width smaller than width of the secondary region slit.

According to a preferred embodiment of the present invention, an angle of 40° to 45° is formed the main region branch electrode and the main region trunk electrode.

According to a preferred embodiment of the present invention, an angle of 45° is formed the secondary region branch electrode and the secondary region trunk electrode.

According to a preferred embodiment of the present invention, the main region branch electrode has a width greater than 2 µm and less than 5 µm, the main region slit has a width greater than 2 µm and less than 5 µm.

According to a preferred embodiment of the present invention, the secondary region branch electrode has a width greater than 3.5 µm and less than 6 µm, the secondary region slit has a width greater than 3.5 µm and less than 6 µm.

According to a preferred embodiment of the present invention, the area ratio between the main region pixel electrode and the secondary region pixel electrode is greater than ¼ and less than 4.

According to a preferred embodiment of the present invention, the pixel electrode is made of indium-tin-oxide (ITO).

According to a preferred embodiment of the present invention, the array substrate further comprises: an array substrate common voltage wire, each sub-pixel further comprises a storage capacitor, the storage capacitor comprising: a first electrode plate and a second electrode plate, disposed opposite to each other, the first electrode plate electrically connected to the array substrate common voltage wire, and the second electrode plate electrically connected to the drain of the control TFT.

According to a preferred embodiment of the present invention, gate of the control TFT, scan line, array substrate common voltage wire, and first electrode plate are all located in a first metal layer; source and drain of the control TFT, data line, and second electrode plate are all located in a second metal layer, the second metal layer and the first metal layer are stacked and mutually insulated from each other.

According to a preferred embodiment of the present invention, the pixel electrode further comprises a second connection electrode, connected to the main region pixel electrode, the second connection is stacked upon the drain of the control TFT, an insulation layer is disposed between the second connection electrode and the drain of the control TFT, the insulation layer is disposed with pixel electrode connection via penetrating the insulation layer, the second connection electrode is electrically connected to the drain of the control TFT through the pixel electrode connection via.

The present invention also provides an array substrate, comprising: a plurality of sub-pixels arranged in an array, a plurality of scan lines arranged in a parallel, interleaved and horizontal manner, and a plurality of data lines arranged in a parallel, interleaved and vertical manner;

each row of sub-pixels corresponding to a scan line, each column of sub-pixels corresponding to a data line, each sub-pixel comprising: a control thin film transistor (TFT) and a pixel electrode; the control TFT having a gate connected the scan line corresponding to the sub-pixel, a source connected to the data line corresponding to the sub-pixel, and a drain connected to the pixel electrode; the pixel electrode comprising: a main region pixel electrode and a secondary region pixel electrode, layout with a gap in-between, and a first connection electrode electrically connected to the main region pixel electrode and the secondary region pixel electrode;

the main region pixel electrode comprising: a cross-shape main region trunk electrode, the main region trunk electrode dividing the main region pixel electrode into four main region orientation areas, with each main region orientation area being disposed with a plurality of parallel stripe-shaped main region branch electrodes electrically connected to the main region trunk electrode, a main region slit being formed between two adjacent main region branch electrodes, the main region branch electrodes in two adjacent main region orientation areas being symmetrical with respect to the main region trunk electrode; the secondary region pixel electrode comprising: a cross-shape secondary region trunk electrode, the secondary region trunk electrode dividing the secondary region pixel electrode into four secondary region orientation areas, with each secondary region orientation area being disposed with a plurality of parallel stripe-shaped secondary region branch electrodes electrically connected to the secondary region trunk electrode, a secondary region slit being formed between two adjacent secondary region branch electrodes, the secondary region branch electrodes in two adjacent secondary region orientation areas being symmetrical with respect to the secondary region trunk electrode;

the main region branch electrodes having a width smaller than width of the secondary region branch electrodes, the main region slit having a width smaller than width of the secondary region slit;

wherein the main region branch electrode having a width greater than 2 µm and less than 5 µm, the main region slit having a width greater than 2 µm and less than 5 µm;

wherein the secondary region branch electrode having a width greater than 3.5 µm and less than 6 µm, the secondary region slit having a width greater than 3.5 µm and less than 6 µm.

Compared to the known techniques, the present invention provides the following advantages: the present invention provides an array substrate, comprising: a plurality of sub-pixels arranged in an array, a plurality of scan lines arranged in a parallel, interleaved and horizontal manner, and a plurality of data lines arranged in a parallel, interleaved and vertical manner; each row of sub-pixels corresponding to a scan line, each column of sub-pixels corresponding to a data line, each sub-pixel comprising: a control TFT and a pixel electrode; the pixel electrode comprising: a main region pixel electrode and a secondary region pixel electrode, layout with a gap in-between, and a first connection electrode electrically connected to the main region pixel electrode and the secondary region pixel electrode; the main and secondary region pixel electrodes being of special shape slit structure, the main region branch electrodes having a width smaller than width of the secondary region branch electrodes, the main region slit having a width smaller than width of the secondary region slit. The structural difference in the main and secondary region pixel electrodes is used to improve color shift, leading to reducing the number of TFTs in each pixel, improving pixel aperture ratio. The same voltage due to the connection between the main and secondary region pixel electrodes reduces the difficulty in balance control of the best common voltage.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
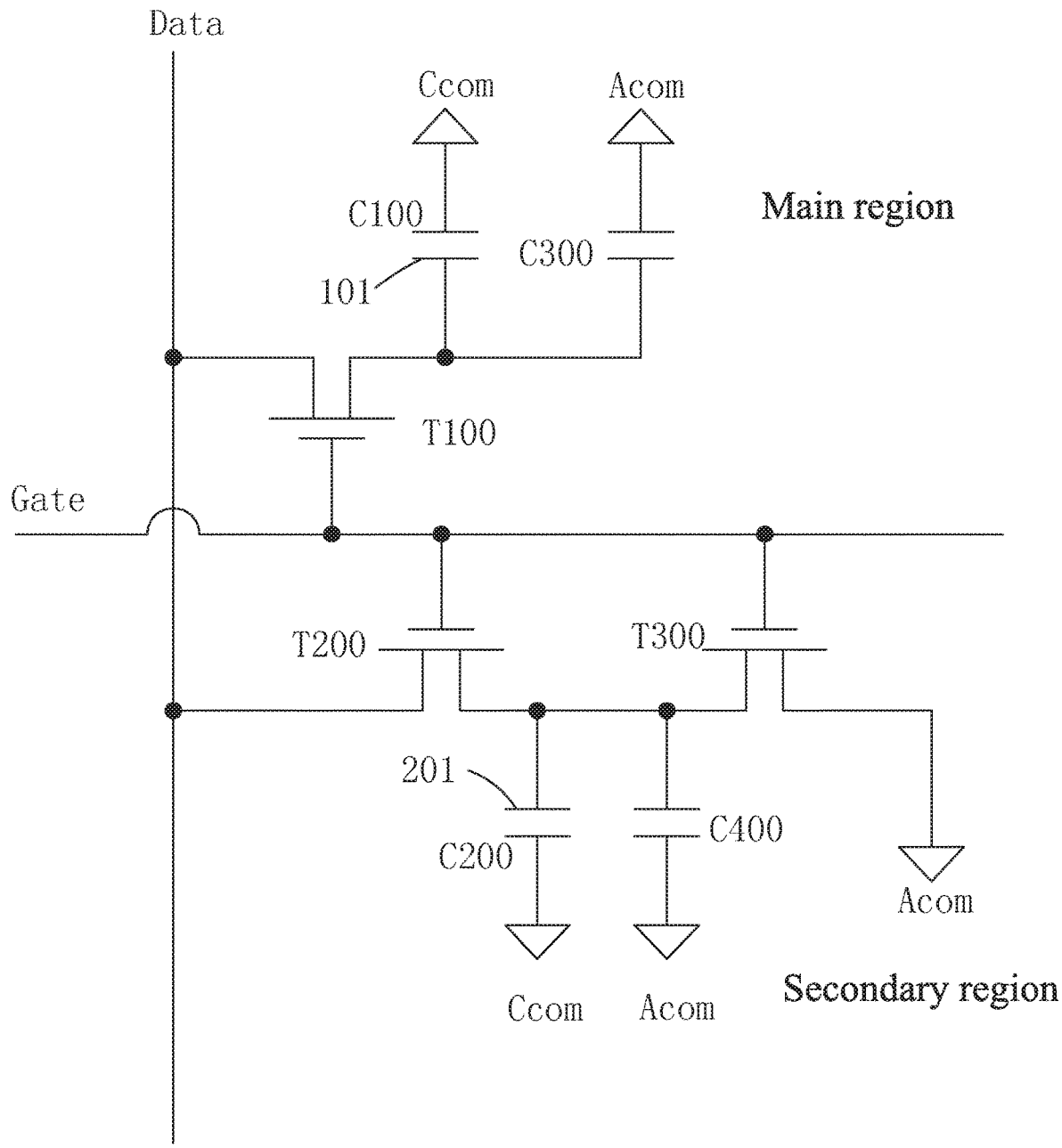
FIG. 1 is a schematic view showing an equivalent circuit of a sub-pixel in known LCD.
Figure 2:
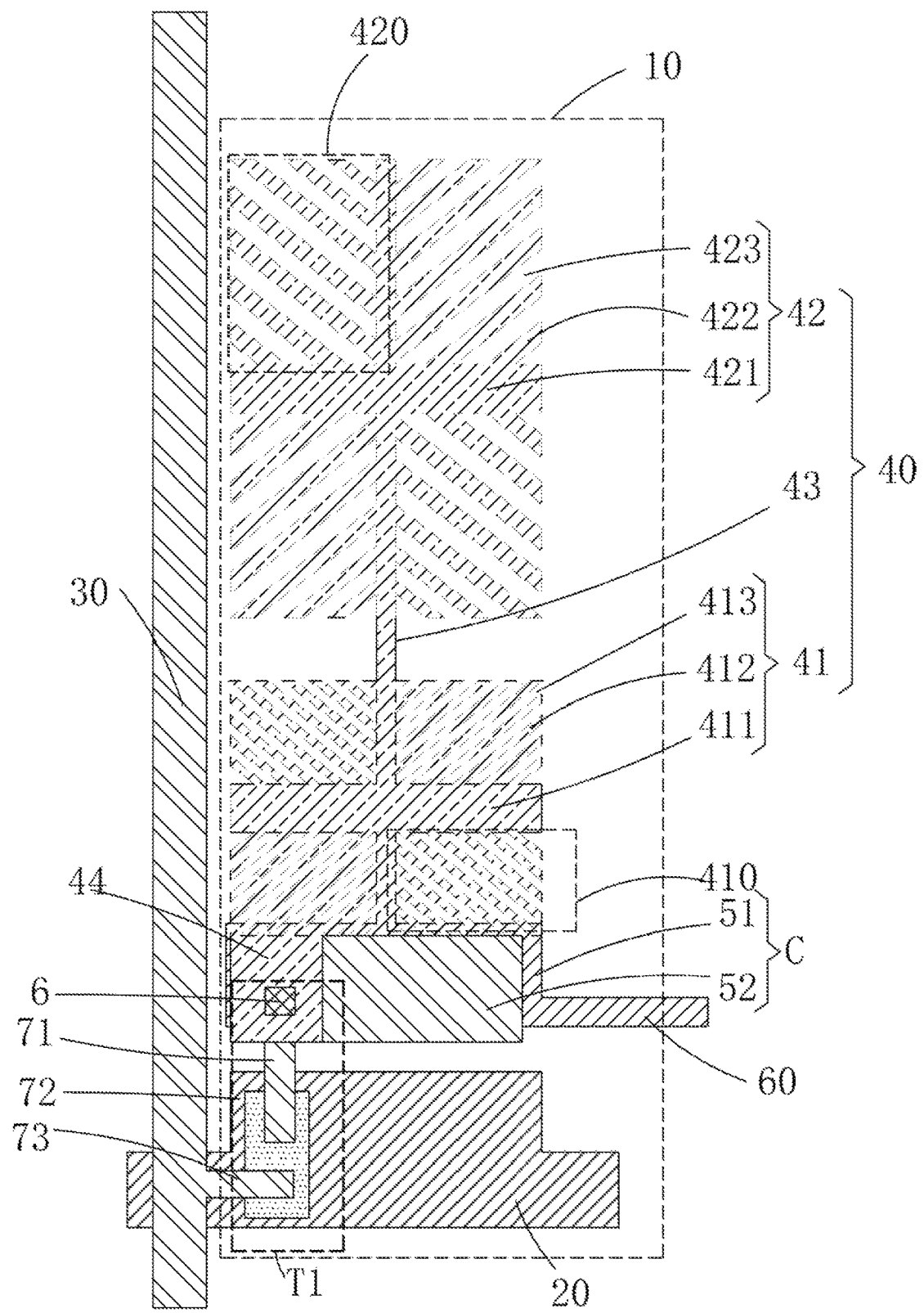
FIG. 2 is a schematic view showing the structure of an array substrate according to the present invention.

Refer to FIG. 2. The present invention provides an array substrate, comprising: a plurality of sub-pixels 10 arranged in an array, a plurality of scan lines 20 arranged in a parallel, interleaved and horizontal manner, and a plurality of data lines 30 arranged in a parallel, interleaved and vertical manner;

each row of sub-pixels 10 corresponding to a scan line 20, each column of sub-pixels 10 corresponding to a data line 30, each sub-pixel 10 comprising: a control thin film transistor (TFT) T1 and a pixel electrode 40; the control TFT T1 having a gate connected the scan line 20 corresponding to the sub-pixel, a source connected to the data line 30 corresponding to the sub-pixel, and a drain connected to the pixel electrode 40; the pixel electrode 40 comprising: a main region pixel electrode 41 and a secondary region pixel electrode 42, layout with a gap in-between, and a first connection electrode 43 electrically connected to the main region pixel electrode 41 and the secondary region pixel electrode 42;

the main region pixel electrode 41 comprising: a cross-shape main region trunk electrode 411, the main region trunk electrode 411 dividing the main region pixel electrode 41 into four main region orientation areas 410, with each main region orientation area 410 being disposed with a plurality of parallel stripe-shaped main region branch electrodes 412 electrically connected to the main region trunk electrode 411, a main region slit 413 being formed between two adjacent main region branch electrodes 412, the main region branch electrodes 412 in two adjacent main region orientation areas 410 being symmetrical with respect to the main region trunk electrode 411; the secondary region pixel electrode 42 comprising: a cross-shape secondary region trunk electrode 421, the secondary region trunk electrode 421 dividing the secondary region pixel electrode 42 into four secondary region orientation areas 420, with each secondary region orientation area 420 being disposed with a plurality of parallel stripe-shaped secondary region branch electrodes electrically 422 connected to the secondary region trunk electrode 421, a secondary region slit 423 being formed between two adjacent secondary region branch electrodes 422, the secondary region branch electrodes 422 in two adjacent secondary region orientation areas 420 being symmetrical with respect to the secondary region trunk electrode 421.

It should be noted that the main region branch electrodes 412 has a width smaller than width of the secondary region branch electrodes 422, and the main region slit 413 has a width smaller than width of the secondary region slit 423. In other words, the main region branch electrodes 412 in thinner than the secondary region branch electrodes 422, and the main region branch electrodes 412 in the main region pixel electrode 41 has a higher distribution density than the secondary region branch electrodes 422 in the secondary region pixel electrode 42. As such, when the array substrate is used in LCD, the main region pixel electrode 41 has a stronger electrical field than the secondary region pixel electrode 42 after electricity applied to the pixel electrode 40, which lead to a larger polarization angle for the LC molecules corresponding to the main region pixel electrode 41 than the LC molecules corresponding to the secondary region pixel electrode 42, and a higher aperture ratio for the area corresponding to the main region pixel electrode 41 than the area corresponding to the secondary region pixel electrode 42. Therefore, the color shift in LCD is improved.

Furthermore, the present invention can further enhance the difference between the main region pixel electrode 41 and the secondary region pixel electrode 42 for further improvement by adjusting the area ratio between the main region pixel electrode 41 and the secondary region pixel electrode 42, the angle between the main region branch electrode 412 and main region trunk electrode 411, and the angle between the secondary region branch electrode 422 and secondary region trunk electrode 421.

Specifically, the main region branch electrode 412 and the main region trunk electrode 411 form an angle from 40° to 45° in-between. Preferably, the main region branch electrode 412 and the main region trunk electrode 411 form an angle of 45° in-between.

Specifically, the secondary region branch electrode 422 and the secondary region trunk electrode 421 form an angle of 45° in-between.

Specifically, the main region branch electrode 412 has a width (i.e., the wire width of the main region pixel electrode 41) greater than 2 μm and less than 5 μm, the main region slit 413 has a width (i.e., the wire gap of the main region pixel electrode 41) greater than 2 μm and less than 5 μm. Preferably, the width of the main region branch electrode 412 is 3.5 μm, and the width of the main region slit 413 is 2.5 μm.

Specifically, the secondary region branch electrode 422 has a width (i.e., the wire width of the secondary region pixel electrode 42) greater than 3.5 μm and less than 6 μm, the secondary region slit 423 has a width (i.e., the wire gap of the secondary region pixel electrode 42) greater than 3.5 μm and less than 6 μm. Preferably, the width of the secondary region branch electrode 422 is 5 μm, and the width of the secondary region slit 423 is 5 μm.

Optionally, the area ratio between the main region pixel electrode 41 and the secondary region pixel electrode 42 is greater than ¼ and less than 4. Preferably, the area ratio between the main region pixel electrode 41 and the secondary region pixel electrode 42 is 2:3.

Furthermore, refer to FIG. 2. the array substrate further comprises: an array substrate common voltage wire 60, each sub-pixel 10 further comprises a storage capacitor C, the storage capacitor C comprising: a first electrode plate 51 and a second electrode plate 52, disposed opposite to each other, the first electrode plate 51 electrically connected to the array substrate common voltage wire 50, and the second electrode plate 52 electrically connected to the drain of the control TFT T1.

The gate 71 the control TFT T1, scan line 20, array substrate common voltage wire 60, and first electrode plate 51 are all located in a first metal layer; the source 73 and drain 72 of the control TFT T1, data line 30, and second electrode plate 52 are all located in a second metal layer, the second metal layer and the first metal layer are stacked and mutually insulated from each other.

The pixel electrode 40 further comprises a second connection electrode 44, connected to the main region pixel electrode 41, the second connection 44 is stacked upon the drain of the control TFT T1, an insulation layer is disposed between the second connection electrode 44 and the drain of the control TFT T1, the insulation layer is disposed with pixel electrode connection via 6 penetrating the insulation layer, the second connection electrode 44 is electrically connected to the drain of the control TFT T1 through the pixel electrode connection via 6.

Preferably, the material of the first metal layer and the second metal layer is a combination of one or more of metals, such as, aluminum, molybdenum and copper. The material of the insulation between the first metal layer and the second metal layer, the second metal layer and the pixel electrodes is a combination of one or both of silicon oxide (SiOx) and silicon nitride (SiNx). The material of the pixel electrode 40 is ITO.

Preferably, the first connection electrode 43 is electrically connected to the main region trunk electrode 411 and the secondary region trunk electrode 42, with an extension direction corresponding to the layout direction of the main region pixel electrode 41 and secondary region pixel electrode 42.

It should be noted, in the array substrate of the present invention, each sub-pixel uses only one control TFT T1. Compared to prior art, the number of TFTs is reduced and the pixel aperture ratio is increased. Also, the present invention creates difference between the main region pixel electrode 41 and the second region pixel electrode 42 by adjusting the wire width, wire gap, area ratio of the main region pixel electrode 41 and the second region pixel electrode 42 and the tilt angle of the branch electrodes, in particular, so that the areas corresponding to the main region pixel electrode 41 has a transmittance than the area corresponding to the second region pixel electrode to improve the color shift when the array substrate is used in LCD. In addition, the first connection electrode 43 is electrically connected to the main region pixel electrode 41 and the second region pixel electrode 42 so that the main region pixel electrode 41 and the second region pixel electrode 42 can be controlled by a single TFT, and the main region pixel electrode 41 and the second region pixel electrode 42 have the same voltage, which achieves the object to reduce the difficulty in balance control of the best common voltage for the main region and the secondary region.

In summary, the present invention provides an array substrate, comprising: a plurality of sub-pixels arranged in an array, a plurality of scan lines arranged in a parallel, interleaved and horizontal manner, and a plurality of data lines arranged in a parallel, interleaved and vertical manner; each row of sub-pixels corresponding to a scan line, each column of sub-pixels corresponding to a data line, each sub-pixel comprising: a control TFT and a pixel electrode; the pixel electrode comprising: a main region pixel electrode and a secondary region pixel electrode, layout with a gap in-between, and a first connection electrode electrically connected to the main region pixel electrode and the secondary region pixel electrode; the main and secondary region pixel electrodes being of special shape slit structure, the main region branch electrodes having a width smaller than width of the secondary region branch electrodes, the main region slit having a width smaller than width of the secondary region slit. The structural difference in the main and secondary region pixel electrodes is used to improve color shift, leading to reducing the number of TFTs in each pixel, improving pixel aperture ratio. The same voltage due to the connection between the main and secondary region pixel electrodes reduces the difficulty in balance control of the best common voltage.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An array substrate, comprising: a plurality of sub-pixels arranged in an array, a plurality of scan lines arranged in a parallel, interleaved and horizontal manner, and a plurality of data lines arranged in a parallel, interleaved and vertical manner;

each row of sub-pixels corresponding to a scan line, each column of sub-pixels corresponding to a data line, each sub-pixel comprising: a control thin film transistor (TFT) and a pixel electrode; the control TFT having a gate connected to the scan line corresponding to the sub-pixel, a source connected to the data line corresponding to the sub-pixel, and a drain connected to the pixel electrode; the pixel electrode comprising: a main region pixel electrode and a secondary region pixel electrode, a layout with a gap in-between, and a first connection electrode electrically connected to the main region pixel electrode and the secondary region pixel electrode;

the main region pixel electrode comprising: a cross-shape main region trunk electrode, the main region trunk electrode dividing the main region pixel electrode into four main region orientation areas, with each main region orientation area being disposed with a plurality of parallel stripe-shaped main region branch electrodes electrically connected to the main region trunk electrode, a main region slit being formed between two adjacent main region branch electrodes, the main region branch electrodes in two adjacent main region orientation areas being symmetrical with respect to the main region trunk electrode; the secondary region pixel electrode comprising: a cross-shape secondary region trunk electrode, the secondary region trunk electrode dividing the secondary region pixel electrode into four secondary region orientation areas, with each secondary region orientation area being disposed with a plurality of parallel stripe-shaped secondary region branch electrodes electrically connected to the secondary region trunk electrode, a secondary region slit being formed between two adjacent secondary region branch electrodes, the secondary region branch electrodes in two adjacent secondary region orientation areas being symmetrical with respect to the secondary region trunk electrode;

the main region branch electrodes having a width smaller than a width of the secondary region branch electrodes, the main region slit having a width smaller than a width of the secondary region slit;

wherein the array substrate further comprises: an array substrate common voltage wire, each sub-pixel further comprises a storage capacitor, the storage capacitor comprising: a first electrode plate and a second electrode plate disposed opposite to each other, the first electrode plate electrically connected to the array substrate common voltage wire, and the second electrode plate electrically connected to the drain of the control TFT;

wherein a gate of the control TFT, scan line, array substrate common voltage wire, and first electrode plate are all located in a first metal layer; a source and a drain of the control TFT, data line, and second electrode plate are all located in a second metal layer, the second metal layer and the first metal layer are stacked and mutually insulated from each other.

2. The array substrate as claimed in claim 1, wherein an angle of 40° to 45° is formed the main region branch electrode and the main region trunk electrode.

3. The array substrate as claimed in claim 1, wherein an angle of 45° is formed the secondary region branch electrode and the secondary region trunk electrode.

4. The array substrate as claimed in claim 1, wherein the main region branch electrode has a width greater than 2 μm and less than 5 μm, the main region slit has a width greater than 2 μm and less than 5 μm.

5. The array substrate as claimed in claim 1, wherein the secondary region branch electrode has a width greater than 3.5 μm and less than 6 μm, the secondary region slit has a width greater than 3.5 μm and less than 6 μm.

6. The array substrate as claimed in claim 1, wherein the area ratio between the main region pixel electrode and the secondary region pixel electrode is greater than ¼ and less than 4.

7. The array substrate as claimed in claim 1, wherein the pixel electrode is made of indium-tin-oxide (ITO).

8. The array substrate as claimed in claim 1, wherein the pixel electrode further comprises a second connection electrode, connected to the main region pixel electrode, the second connection is stacked upon the drain of the control TFT, an insulation layer is disposed between the second connection electrode and the drain of the control TFT, the insulation layer is disposed with pixel electrode connection via penetrating the insulation layer, the second connection electrode is electrically connected to the drain of the control TFT through the pixel electrode connection via.

9. An array substrate, comprising: a plurality of sub-pixels arranged in an array, a plurality of scan lines arranged in a parallel, interleaved and horizontal manner, and a plurality of data lines arranged in a parallel, interleaved and vertical manner;

each row of sub-pixels corresponding to a scan line, each column of sub-pixels corresponding to a data line, each sub-pixel comprising: a control thin film transistor (TFT) and a pixel electrode; the control TFT having a gate connected to the scan line corresponding to the sub-pixel, a source connected to the data line corresponding to the sub-pixel, and a drain connected to the pixel electrode; the pixel electrode comprising: a main region pixel electrode and a secondary region pixel electrode, a layout with a gap in-between, and a first connection electrode electrically connected to the main region pixel electrode and the secondary region pixel electrode;

the main region pixel electrode comprising: a cross-shape main region trunk electrode, the main region trunk electrode dividing the main region pixel electrode into four main region orientation areas, with each main region orientation area being disposed with a plurality of parallel stripe-shaped main region branch electrodes electrically connected to the main region trunk electrode, a main region slit being formed between two adjacent main region branch electrodes, the main region branch electrodes in two adjacent main region orientation areas being symmetrical with respect to the main region trunk electrode; the secondary region pixel electrode comprising: a cross-shape secondary region trunk electrode, the secondary region trunk electrode dividing the secondary region pixel electrode into four secondary region orientation areas, with each secondary region orientation area being disposed with a plurality of parallel stripe-shaped secondary region branch electrodes electrically connected to the secondary region trunk electrode, a secondary region slit being formed between two adjacent secondary region branch electrodes, the secondary region branch electrodes in two adjacent secondary region orientation areas being symmetrical with respect to the secondary region trunk electrode;

the main region branch electrodes having a width smaller than a width of the secondary region branch electrodes, the main region slit having a width smaller than a width of the secondary region slit;

wherein the main region branch electrode having a width greater than 2 μm and less than 5 μm, the main region slit having a width greater than 2 μm and less than 5 μm;

wherein the secondary region branch electrode having a width greater than 3.5 μm and less than 6 μm, the secondary region slit having a width greater than 3.5 μm and less than 6 μm;

wherein the array substrate further comprises: an array substrate common voltage wire, each sub-pixel further comprises a storage capacitor, the storage capacitor comprising: a first electrode plate and a second electrode plate disposed opposite to each other, the first electrode plate electrically connected to the array substrate common voltage wire, and the second electrode plate electrically connected to the drain of the control TFT;

wherein a gate of the control TFT, scan line, array substrate common voltage wire, and first electrode plate are all located in a first metal layer; a source and a drain of the control TFT, data line, and second electrode plate are all located in a second metal layer, the second metal layer and the first metal layer are stacked and mutually insulated from each other.

10. The array substrate as claimed in claim 9, wherein an angle of 40° to 45° is formed the main region branch electrode and the main region trunk electrode.

11. The array substrate as claimed in claim 9, wherein an angle of 45° is formed the secondary region branch electrode and the secondary region trunk electrode.

12. The array substrate as claimed in claim 9, wherein the area ratio between the main region pixel electrode and the secondary region pixel electrode is greater than ¼ and less than 4.

13. The array substrate as claimed in claim 9, wherein the pixel electrode is made of indium-tin-oxide (ITO).

14. The array substrate as claimed in claim 9, wherein the pixel electrode further comprises a second connection electrode, connected to the main region pixel electrode, the second connection is stacked upon the drain of the control TFT, an insulation layer is disposed between the second connection electrode and the drain of the control TFT, the insulation layer is disposed with pixel electrode connection via penetrating the insulation layer, the second connection electrode is electrically connected to the drain of the control TFT through the pixel electrode connection via.

* * * * *